United States Patent
Lei et al.

(10) Patent No.: US 11,282,798 B2
(45) Date of Patent: Mar. 22, 2022

(54) CHIP CORNER AREAS WITH A DUMMY FILL PATTERN

(71) Applicant: GLOBALFOUNDRIES U.S. Inc., Santa Clara, CA (US)

(72) Inventors: Qiang Lei, Dresden (DE); Bo Bai, Dresden (DE)

(73) Assignee: GlobalFoundries U.S. Inc., Santa Clara, CA (US)

( * ) Notice: Subject to any disclaimer, the term of this patent is extended or adjusted under 35 U.S.C. 154(b) by 0 days.

(21) Appl. No.: 16/796,372

(22) Filed: Feb. 20, 2020

(65) Prior Publication Data

US 2021/0265286 A1  Aug. 26, 2021

(51) Int. Cl.

| H01L 23/544 | (2006.01) |
|---|---|
| H01L 23/00 | (2006.01) |
| H01L 23/58 | (2006.01) |
| H01L 27/02 | (2006.01) |
| G06F 30/392 | (2020.01) |
| H01L 21/66 | (2006.01) |

(52) U.S. Cl.
CPC .......... *H01L 23/564* (2013.01); *G06F 30/392* (2020.01); *H01L 23/585* (2013.01); *H01L 27/0207* (2013.01); *H01L 22/30* (2013.01)

(58) Field of Classification Search
CPC ... H01L 21/76224–76237; H01L 22/30; H01L 22/32; H01L 22/34; H01L 23/564; H01L 27/0207; H01L 29/0649; H01L 29/0653; H01L 2223/54453–5446; H01L 2223/5448; G06F 30/392

See application file for complete search history.

(56) References Cited

U.S. PATENT DOCUMENTS

| 6,593,214 B1 * | 7/2003 | Igarashi | H01L 21/28512 |
| | | | 438/480 |
| 6,603,162 B1 * | 8/2003 | Uchiyama | H01L 23/544 |
| | | | 257/296 |
| 6,876,062 B2 | 4/2005 | Lee et al. | |
| 7,202,550 B2 * | 4/2007 | Fu | H01L 23/544 |
| | | | 257/620 |
| 8,368,180 B2 | 2/2013 | Yu et al. | |
| 8,373,254 B2 | 2/2013 | Chen et al. | |
| 8,963,291 B2 | 2/2015 | Furusawa et al. | |
| 9,543,254 B2 | 1/2017 | Lamorey et al. | |
| 2001/0017394 A1 * | 8/2001 | Mori | H01L 21/76229 |
| | | | 257/510 |
| 2002/0089036 A1 * | 7/2002 | Shinkawata | H01L 23/528 |
| | | | 257/528 |
| 2009/0166676 A1 * | 7/2009 | Lee | H01L 29/66628 |
| | | | 257/192 |
| 2010/0078769 A1 * | 4/2010 | West | H01L 23/562 |
| | | | 257/620 |
| 2013/0169308 A1 * | 7/2013 | Ouyang | H01L 22/34 |
| | | | 324/762.03 |
| 2014/0167199 A1 * | 6/2014 | Cheng | H01L 21/78 |
| | | | 257/443 |

(Continued)

*Primary Examiner* — Eric A. Ward
(74) *Attorney, Agent, or Firm* — Thompson Hine LLP; Anthony Canale

(57) ABSTRACT

Structures for a corner area of a chip and methods of fabricating a structure for a corner area of a chip. A chip includes an active circuit region, an integrated circuit in the active circuit region, and a corner area. The corner area includes dummy structures that provide dummy fill.

9 Claims, 3 Drawing Sheets

(56) References Cited

U.S. PATENT DOCUMENTS

2016/0172359 A1\* 6/2016 Yoon .................... H01L 29/785
　　　　　　　　　　　　　　　　　　　　　257/401
2020/0051875 A1\* 2/2020 Pittner .................. H01L 22/34
2020/0294871 A1\* 9/2020 Shu .................... H01L 23/5226

\* cited by examiner

CHIP CORNER AREAS WITH A DUMMY FILL PATTERN

BACKGROUND

The present invention relates to semiconductor device fabrication and integrated circuits and, more specifically, to structures for a corner area of a chip and methods of fabricating a structure for a corner area of a chip.

A substrate may be processed to fabricate a group of nominally identical die or chips. Among other factors, the number of chips yielded from the substrate is a function of the individual chip size, as well as the substrate size. Each die or chip includes integrated circuits with devices formed by the front-end-of-line processing, a local interconnect level formed by middle-end-of-line processing, and stacked metallization levels of an interconnect structure formed by back-end-of line processing. Scribe lanes are present on the substrate between the chips and are used as dicing lines during a dicing process to singulate the chips. Following singulation, the chips may be individually packaged.

Integrated circuits are sensitive to process variations, which may significantly impact the power, performance, and reliability of the chips. Process variations can be local or may extend across the chip, or even may even appear substrate-to-substrate or lot-to-lot. Process variations need to be observed and analyzed in order to improve design margins and to also understand the effect on yield. To that end, test structures may be placed in the scribe lanes on selected substrates to observe and track the effects of process variations and to sample device parameters.

Generally, the placement of test structures in the scribe lanes is unrestricted. However, certain device parameters of the test structures may exhibit a dependence on the local environment. For example, the local density of features, particularly the local density of features proximate to chip corners, may influence device parameters of the test structures. The local density of features proximate to chip corners may also influence device parameters of the devices of the integrated circuits Improved structures for a corner area of a chip and methods of fabricating a structure for a corner area of a chip are needed.

SUMMARY

In an embodiment of the invention, a structure includes a chip having an active circuit region, an integrated circuit in the active circuit region, and a corner area. The structure further includes a plurality of dummy structures that are positioned in the corner area.

In an embodiment of the invention, a structure includes a substrate having a plurality of chips and a plurality of scribe lines arranged to surround each chip. Each chip includes an active circuit region, an integrated circuit in the active circuit region, and a corner area. The structure further includes a plurality of dummy structures that are positioned in the corner area of each chip.

In an embodiment of the invention, a method includes forming a chip having an active circuit region, an integrated circuit in the active circuit region, and a corner area. The method further includes forming a plurality of dummy structures that are positioned in the corner area.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
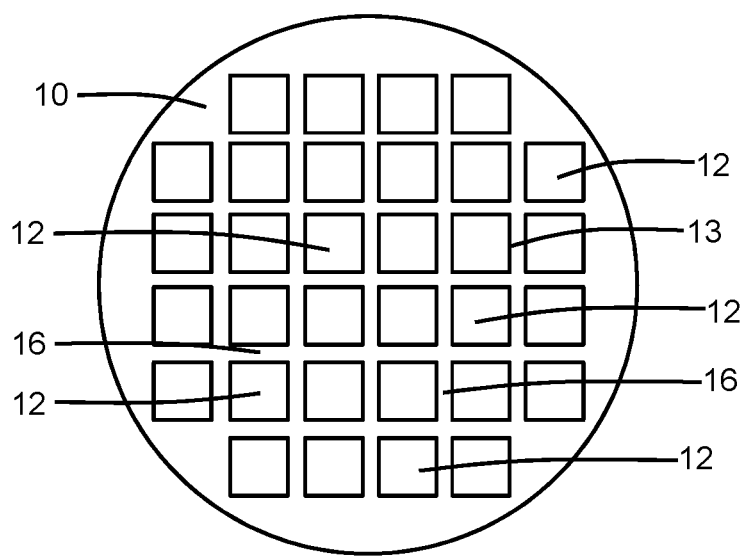
FIG. 1 is a top view of a substrate including chips in accordance with embodiments of the invention.
Figure 2:
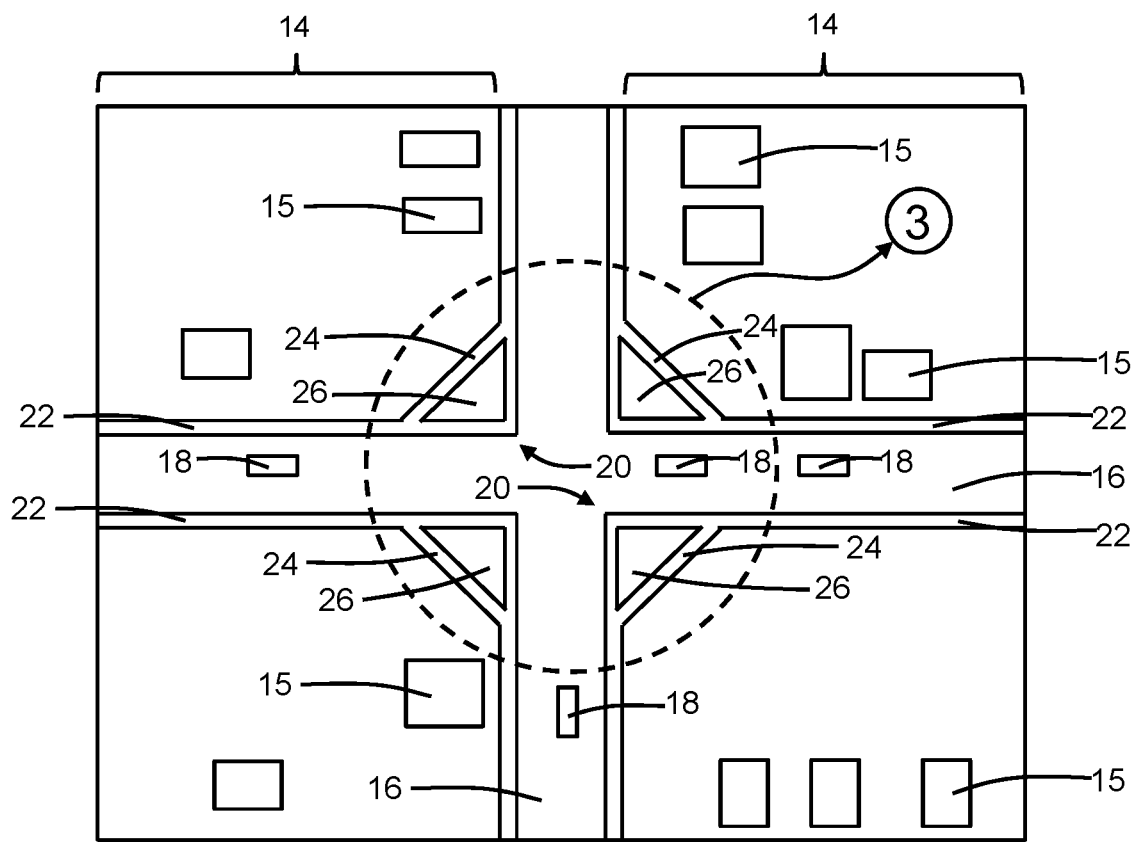
FIG. 2 is an enlarged view of a portion of FIG. 1.

With reference to FIGS. 1-4 and in accordance with embodiments of the invention, a substrate 10 includes a usable chip area on its frontside that has been processed to fabricate a group of substantially-identical die or chips 12. The substrate 10 may be comprised of a crystalline semiconductor material, such as single-crystal silicon, and may be lightly doped with a dopant to alter its electrical properties. For example, the substrate 10 may be a bulk single-crystal silicon substrate lightly doped with a p-type dopant to provide p-type conductivity.

Each chip 12 has an active circuit region 14 that includes integrated circuits 15 that implement chip functionality. Each integrated circuit 15 may include devices, such as planar field-effect transistors, non-planar field-effect transistors, heterojunction bipolar transistors, etc., that are fabricated by front-end-of-line processing.

The number of chips 12 yielded from the substrate 10 is a function of the chip size, as well as the substrate size. Each of the chips 12 includes a distinct section of the semiconductor material of the substrate 10, and each chip 12 has a perimeter 13 defined at its outer edges. The chips 12 may be arranged with a spaced-apart arrangement in an array or matrix of rows and columns.

Scribe lines 16 define scribe lanes that are arranged between adjacent rows of chips 12 in the array and between adjacent columns of chips 12 in the array. Each chip 12 is surrounded on all sides at its perimeter 13 by scribe lines 16. The scribe lines 16 represent a grid of cutting lines along which the chips 12 may be diced using a dicing saw or a laser, without inflicting damage to the active circuit region 14 of the chip 12. Following physical singulation, each chip 12 may then be packaged.

Test structures 18 may be positioned in the scribe lines 16 with a given arrangement. The test structures 18 may be electrically tested, before the substrate 10 is singulated into chips 12, for electrical shorts, opens, resistance, etc. For example, the test structures 18 may be unsilicided polysilicon resistors that are tested for values of resistance. The semiconductor material of the substrate 10 in the scribe lines 16 and the test structures 18 may be removed by the physical singulation of the chips 12.

Each chip 12 has corner areas 20 that are located outside of the active circuit region 14 and inside of the perimeter 13 of the chip 12. The corner areas 20, which are distributed about the perimeter 13 of each chip 12, are generally defined by the intersections of the rows of scribe lines 16 with the columns of scribe lines 16. The trench isolation region 22 in each chip 12 may extend about the entire perimeter 13 of each chip 12, including the corner areas 20. The trench isolation region 22 surrounds a section of the substrate 10 of each chip 12. The section of the substrate 10 has generally the same perimeter 13 as the chip 12. In the corner areas 20, the trench isolation region 24 in each chip 12 extends diagonally in the section of the substrate 10 to connect to different portions of the trench isolation region 22 in an angled or chamfered arrangement. The trench isolation regions 22, 24 may be formed by patterning the semiconductor material of the substrate 10 to define trenches and forming planarized portions of a dielectric material (e.g., silicon dioxide) deposited inside the trenches. The corner areas 20 may survive the singulation process and, following singulation, may remain as integral parts of the chips 12.

Each corner area 20 of each chip 12 includes a region 26 of the substrate 10 that is surrounded by the trench isolation regions 22, 24. The diagonal arrangement of the trench isolation region 24 relative to the trench isolation region 22 provides each region 26 with a generally triangular shape. In an embodiment, each region 26 may have the shape of a right triangle. The trench isolation region 24 of each corner area 20 is arranged in the section of the substrate 10 associated with each chip 12 between the active circuit region 14 and each region 26.

Figure 5:
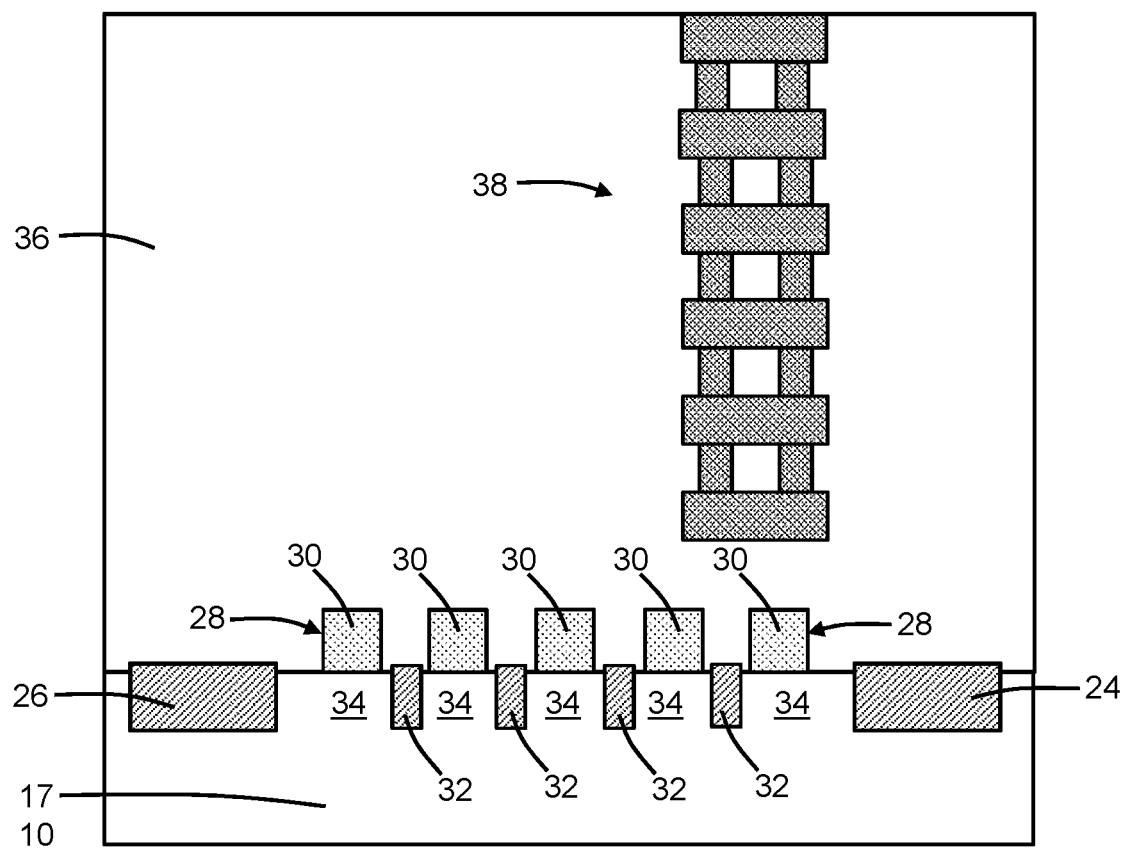
FIG. 5 is a cross-sectional view at a fabrication stage subsequent to FIG. 4.

Each region 26 includes dummy structures 28 that are arranged in the respective corner area 20 as dummy fill. The dummy structures 28 are non-functional and electrically inactive, in contrast to the devices of the integrated circuits 15. The non-functionality of the dummy structures 28 may result, for example, from the absence of connections between the dummy structures 28 and the integrated circuits 15 in the active circuit region 14 or connections to the interconnect structure 36 (FIG. 5) of the chip. The dummy structures 28 may be formed by front-end-of-line processing. In an embodiment, the dummy structures 28 may be formed by front-end-of-line processing in conjunction with the formation of the devices of the integrated circuits 15. In an embodiment, the dummy structures 28 may be arranged in a pattern, such as an array.

The dummy structures 28 in each region 26 may include discrete portions 34 of the substrate 10 that are defined by trench isolation regions 32 formed in the region 26. Each trench isolation region 32 may surround one of the discrete portions 34 of the substrate 10. The dummy structures 28 in each region 26 may also include dummy features 30 that are arranged on and in direct contact with the portions 34 of the substrate 10 and the trench isolation regions 32. The dummy features 30 project upwardly in a direction away from a top surface 11 of the portions 34 of the substrate 10 in each region 26. Each dummy feature 30 may extend lengthwise across one of the portions 34 of the substrate 10 and onto the trench isolation regions 32 adjacent to opposite side edges of the associated portion 34. In an embodiment, one of the dummy features 30 may be positioned on each of the portions 34. In an embodiment, each dummy feature 30 may be narrower in one orthogonal direction (e.g., its width) that its associated portion 34 of the semiconductor material of the substrate 10. The portions 34 of the substrate 10 extend in depth to the depth of the trench isolation regions 32 relative to the top surface 11.

In an embodiment, the dummy features 30 may be formed by patterning a layer of, for example, polycrystalline silicon (i.e., polysilicon) to form strips of material and each polysilicon strip has a length that is greater than its width. In an embodiment, the portions 34 of the substrate 10 may be arranged in the rows and columns of a two-dimensional array, and the dummy features 30 may also be arranged in the rows and columns of a two-dimensional array. The two-dimensional arrays may overlap such that the rows and columns of the different two-dimensional arrays are aligned with each other. In an embodiment, the dummy features 30 may be shaped as rectangular strips having sidewalls and top and bottom surfaces connecting the sidewalls. The dummy features 30 may be formed in conjunction with the formation of other features in the active circuit region 14 on each chip 12, such as the formation of dummy gates that are used in a replacement process to fabricate field-effect transistors of the integrated circuits 15.

Dummy structures 28 may also be formed in the scribe lines 16. The dummy structures 28 formed in the scribe lines 16 may be removed during physical singulation of the chips 12.

The test structures 18 are positioned in the scribe lines 16 with placements that are located at different positions relative to the region 26 of the corner areas 20. The different positions for the test structures 18 place the test structures 18 at different distances from the dummy structures 28. Similarly, the integrated circuits 15 are positioned in the active circuit region 14 with placements at different distances from the dummy structures 28. The impact of the dummy structures 28 on the test structures 18 and the devices of the integrated circuits 15 may be contingent on the separation distance from the dummy structures 28.

The dummy structures 28 may function to improve the density environment for the devices of the integrated circuits 15 and to improve the density environment for test structures 18 positioned proximate to the corner areas 20. The improved density environment may improve the uniformity of the performance of the test structures 18 and/or the uniformity of the performance of the devices of the integrated circuits 15. For example, the dummy structures 28 may improve the performance uniformity of test structures 18 that are unsilicided polysilicon resistors by reducing variations on resistance readout caused by different placements of the test structures 18 relative to the corner areas 20. The dummy structures 28 may also improve the uniformity of the electrical performance of the devices of the integrated circuits 15 proximate to the corner areas 20.

Figure 3:
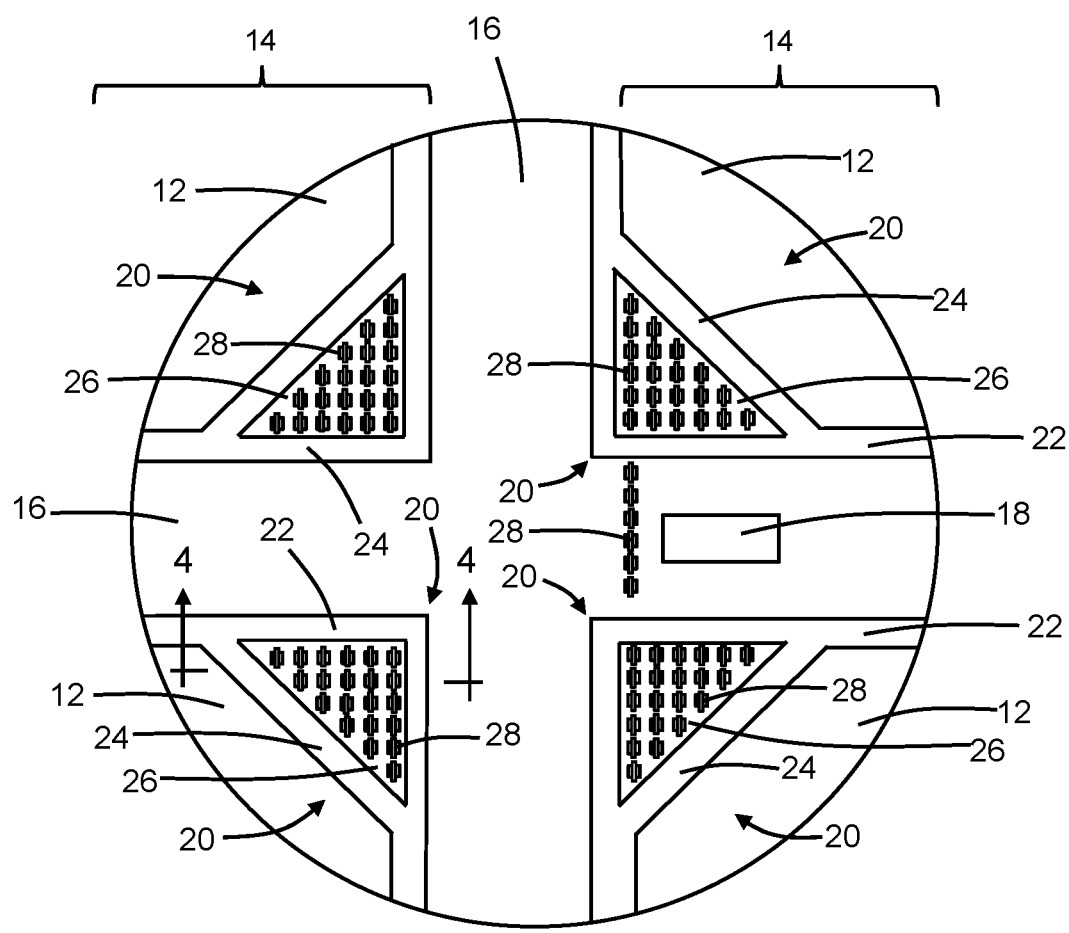
FIG. 3 is an enlarged view of a portion of FIG. 2.
Figure 4:
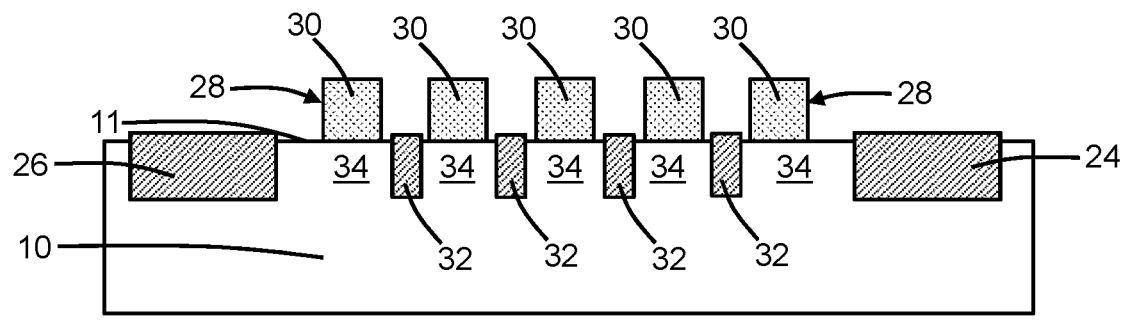
FIG. 4 is a cross-sectional view taken generally along line 4-4 in FIG. 3.

With reference to FIG. 4 in which like reference numerals refer to like features in FIG. 3 and at a subsequent fabrication stage, an interconnect structure 36 may be fabricated by back-end-of-line processing to connect the devices of the integrated circuits 15 of each chip 12 and to provide connections with the environment external to each chip 12. The interconnect structure 36 may include multiple wiring layers that supply conductive paths for signals, clock, power, etc. Passive circuit elements, such as diodes, fuses, anti-fuses, resistors, capacitors, varactors, and inductors, may be integrated into the interconnect structure 36. In an embodiment, the wiring layers of the interconnect structure 36 are not connected with the dummy structures 28 in any manner. The dummy structures 28 in each region 26 are formed by front-end-of-line processing using the substrate 10 before the interconnect structure 36 is formed.

The wiring layers of the interconnect structure 36 may be formed by deposition, polishing, lithography, and etching techniques characteristic of a damascene process. Specifically, for each wiring layer, an interlayer dielectric layer may be deposited and patterned using lithography and etching processes to define trenches and via openings that are lined with a barrier layer (e.g., a bilayer of tantalum and tantalum nitride) and filled by a planarized conductor (e.g., copper). Each interlayer dielectric layer of the interconnect structure 36 may be composed of an inorganic dielectric material, such as silicon dioxide or a low-k dielectric material, that is deposited by, for example, chemical vapor deposition.

A crackstop 38 may be formed in the wiring layers of the interconnect structure 36 at a location proximate to the perimeter 13 of each chip 12. The crackstop 38 includes stacked conductive wires and vias formed as interconnected metallization that is embedded in the interlayer dielectric layers of the different wiring layers of the interconnect structure 36. The crackstop 38 may extend unbroken about the entire perimeter 13 of each chip 12. The crackstop 38, which is not connected with the dummy structures 28, is located between the active circuit region 14 of each chip 12 and the scribe lines 16 surrounding its perimeter 13. The active circuit region 14 of the chip 12 is positioned interior of the crackstop 38 from the scribe lines 16. Each crackstop 38 may function to mitigate the propagation of cracks, which may be initiated during singulation by chipping and cracking along the perimeter 13 of the chip 12, into the active circuit region 14 of the associated chip 12 and, in particular, into the interconnect structure 36.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
    a substrate including a plurality of chips and a plurality of scribe lines arranged to surround each chip, each chip including an active circuit region, a perimeter, an integrated circuit in the active circuit region, and a corner area;
    a first plurality of trench isolation regions in the substrate, each of the first plurality of trench isolation regions positioned between the active circuit region and the corner area of one of the plurality of chips;
    a second plurality of trench isolation regions in the substrate, each of the second plurality of trench isolation regions extending about the perimeter of one of the plurality of chips;
    a test structure and a first plurality of dummy structures positioned in one of the plurality of scribe lines, each of the first plurality of dummy structures including a first portion of the substrate and a first dummy feature positioned on the first portion of the substrate; and
    a second plurality of dummy structures positioned in the corner area of each chip, each of the second plurality of dummy structures including a second portion of the substrate and a second dummy feature positioned on the second portion of the substrate,
    wherein the corner area of each chip is a region of the substrate that is surrounded by one of the first plurality of trench isolation regions and one of the second plurality of trench isolation regions, and each of the first plurality of trench isolation regions extends diagonally between a first portion and a second portion of one of the second plurality of trench isolation regions.

2. The structure of claim 1 wherein the second dummy feature included in each of the second plurality of dummy structures is a strip that is comprised of polycrystalline silicon.

3. The structure of claim 1 wherein the second plurality of dummy structures are arranged in an array.

4. The structure of claim 1 wherein each chip further includes an interconnect structure and a crackstop in the interconnect structure, the crackstop is arranged over the corner area, and the second plurality of dummy structures are free of connections to the interconnect structure.

5. The structure of claim 1 wherein the test structure is an unsilicided polysilicon resistor.

6. The structure of claim 1 the first dummy feature included in each of the first plurality of dummy structures is a strip that is comprised of polycrystalline silicon.

7. The structure of claim 1 wherein the first plurality of dummy structures are arranged in an array.

8. The structure of claim 1 wherein the region of the substrate has a generally triangular shape.

9. The structure of claim 1 wherein the region of the substrate is shaped as a right triangle.

* * * * *